(12) United States Patent
Chen et al.

(10) Patent No.: US 10,497,617 B2
(45) Date of Patent: Dec. 3, 2019

(54) CONDUCTIVE STRUCTURE AND METHOD FOR MANUFACTURING CONDUCTIVE STRUCTURE

(71) Applicant: UNITED MICROELECTRONICS CORP., Hsin-Chu (TW)

(72) Inventors: Li-Han Chen, Tainan (TW); Yen-Tsai Yi, Tainan (TW); Chun-Chieh Chiu, Keelung (TW); Min-Chuan Tsai, New Taipei (TW); Wei-Chuan Tsai, Changhua County (TW); Hsin-Fu Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/224,818

(22) Filed: Dec. 19, 2018

(65) Prior Publication Data

US 2019/0122925 A1    Apr. 25, 2019

Related U.S. Application Data

(62) Division of application No. 15/361,503, filed on Nov. 28, 2016, now Pat. No. 10,199,269.

(51) Int. Cl.
*H01L 21/768* (2006.01)
*H01L 23/535* (2006.01)
(Continued)

(52) U.S. Cl.
CPC .. *H01L 21/76889* (2013.01); *H01L 21/76805* (2013.01); *H01L 21/76843* (2013.01); *H01L 21/76856* (2013.01); *H01L 21/76858* (2013.01); *H01L 21/76876* (2013.01); *H01L 21/76895* (2013.01); *H01L 23/485* (2013.01); *H01L 23/535* (2013.01); *H01L 23/53266* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/41783* (2013.01); *H01L 29/665* (2013.01);
(Continued)

(58) Field of Classification Search
CPC .................. H01L 21/76889; H01L 21/76856
See application file for complete search history.

(56) References Cited

U.S. PATENT DOCUMENTS 7,745,327 B2    6/2010    Preusse
7,875,977 B2    1/2011    Barth et al.
(Continued)

OTHER PUBLICATIONS

Li et al., Title of Invention: Conductive Structure, Layout Structure Including Conductive Structure, and Method for Manufacturing Conductive Structure, U.S. Appl. No. 15/340,982, filed Nov. 2, 2016.

*Primary Examiner* — Eugene Lee
(74) *Attorney, Agent, or Firm* — Winston Hsu (57) ABSTRACT

A conductive structure includes a substrate including a first dielectric layer formed thereon, at least a first opening formed in the first dielectric layer, a low resistive layer formed in the opening, and a first metal bulk formed on the lower resistive layer in the opening. The first metal bulk directly contacts a surface of the first low resistive layer. The low resistive layer includes a carbonitride of a first metal material, and the first metal bulk includes the first metal material.

9 Claims, 5 Drawing Sheets (51) Int. Cl.
 *H01L 23/532* (2006.01)
 *H01L 29/08* (2006.01)
 *H01L 29/161* (2006.01)
 *H01L 29/16* (2006.01)
 *H01L 29/165* (2006.01)
 *H01L 29/24* (2006.01)
 *H01L 29/267* (2006.01)
 *H01L 29/78* (2006.01)
 *H01L 23/485* (2006.01)
 *H01L 29/417* (2006.01)
 *H01L 29/66* (2006.01)
 *H01L 21/285* (2006.01)

(52) U.S. Cl.
 CPC .... *H01L 29/7848* (2013.01); *H01L 21/28518* (2013.01); *H01L 21/76855* (2013.01)

(56) References Cited

U.S. PATENT DOCUMENTS

| | | |
|---|---|---|
| 8,178,437 B2 | 5/2012 | Chang et al. |
| 8,432,037 B2 | 4/2013 | Maekawa |
| 2005/0118796 A1 | 6/2005 | Chiras |
| 2005/0173799 A1 | 8/2005 | Jou |
| 2005/0287803 A1 | 12/2005 | Lee |
| 2006/0211236 A1* | 9/2006 | Bureau ............... C23C 18/1608 438/628 |
| 2008/0284020 A1 | 11/2008 | Ishizaka |
| 2012/0045893 A1 | 2/2012 | Koerner |
| 2013/0082393 A1* | 4/2013 | Kawamura ....... H01L 21/76802 257/773 |
| 2013/0127058 A1 | 5/2013 | Lavoie |
| 2015/0187896 A1 | 7/2015 | Kamineni |
| 2018/0158781 A1* | 6/2018 | Jung ................ H01L 23/53238 |

\* cited by examiner

CONDUCTIVE STRUCTURE AND METHOD FOR MANUFACTURING CONDUCTIVE STRUCTURE

CROSS REFERENCE TO RELATED APPLICATIONS

This patent application is a divisional application of and claims priority to U.S. patent application Ser. No. 15/361,503, filed on Nov. 28, 2016, and entitled "CONDUCTIVE STRUCTURE AND METHOD FOR MANUFACTURING CONDUCTIVE STRUCTURE" the entire contents of which are incorporated herein by reference.

BACKGROUND OF THE INVENTION

1. Field of the Invention

The present invention relates to a conductive structure and a method for manufacturing conductive structure, and more particularly, to a conductive structure and a method for manufacturing conductive structure adopted in both of front-end-of-line (FEOL) process and back-end-of-line (BEOL) process in semiconductor integrated circuit (IC) manufacturing.

2. Description of the Prior Art

Modem integrated circuits are made up of millions of electronic components/devices (e.g., transistors, diodes, resistors, capacitors, etc.). These devices are initially isolated from one another but are later interconnected together to form functional circuits by contacts plugs and interconnection structures. Typical interconnection structures include lateral interconnections, such as metal lines (wirings), and vertical interconnections, such as vias.

The quality of the contact plugs and the interconnection structures drastically affects the performance and reliability of the fabricated circuit. In such a structure, a contact resistance between conductive layers is the most important factor in determining the electrical reliability. Here, even though conductive material having a low resistance may be used to form the contact plugs and/or interconnection structures, the resulting contact resistance may be high, so that the overall resistance is increased, which seriously deteriorates the electrical characteristics of the fabricated circuits.

Therefore, a conductive structure and a method for forming the conductive structure to provide lower the contact resistance is still in need.

SUMMARY OF THE INVENTION

According to the claimed invention, a conductive structure is provided. The conductive structure includes a substrate including a first dielectric layer formed thereon, at least a first opening formed in the first dielectric layer, a low resistive layer formed in the opening, and a first metal bulk formed on the lower resistive layer in the opening. The first metal bulk directly contacts a surface of the first low resistive layer. The low resistive layer includes a carbonitride of a first metal material, and the first metal bulk includes the first metal material.

According to the claimed invention, a method for manufacturing a conductive structure is provided. The method includes the following steps. A substrate including a first dielectric layer formed thereon is provided. And at least an opening is formed in the first dielectric layer. Next, a first transition layer is formed in the opening and followed by forming a second transition layer on the first transition layer. The second transition layer includes a first metal material. Then, a treatment is performed to react the first transition layer and the second transition layer to form a low resistive layer including a carbonitride of the first metal material. Thereafter, the opening is filled up with a first metal bulk, and the first metal bulk including the first metal material.

According to the method for manufacturing the conductive structure provided by the present invention, the treatment is performed to form the low resistive layer, and the low resistive layer serves as both of a barrier layer and a nucleation layer. Since the low resistive layer serves as the barrier layer, no extra barrier layer is needed. Furthermore, since the low resistive layer serves as the nucleation layer for the subsequently formed metal bulk, no extra nucleation layer is needed. Accordingly, thickness of the whole conductive structure is reduced compared with the conventional conductive structure that requires both of the barrier layer and the nucleation layer. More important, the contact resistance is reduced, and the performance of the final fabricated circuits is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for manufacturing a conductive structure provided by a first preferred embodiment of the present invention, wherein:

FIGS. 7-9 are schematic drawings illustrating a method for manufacturing a conductive structure provided by a second preferred embodiment of the present invention, wherein:

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
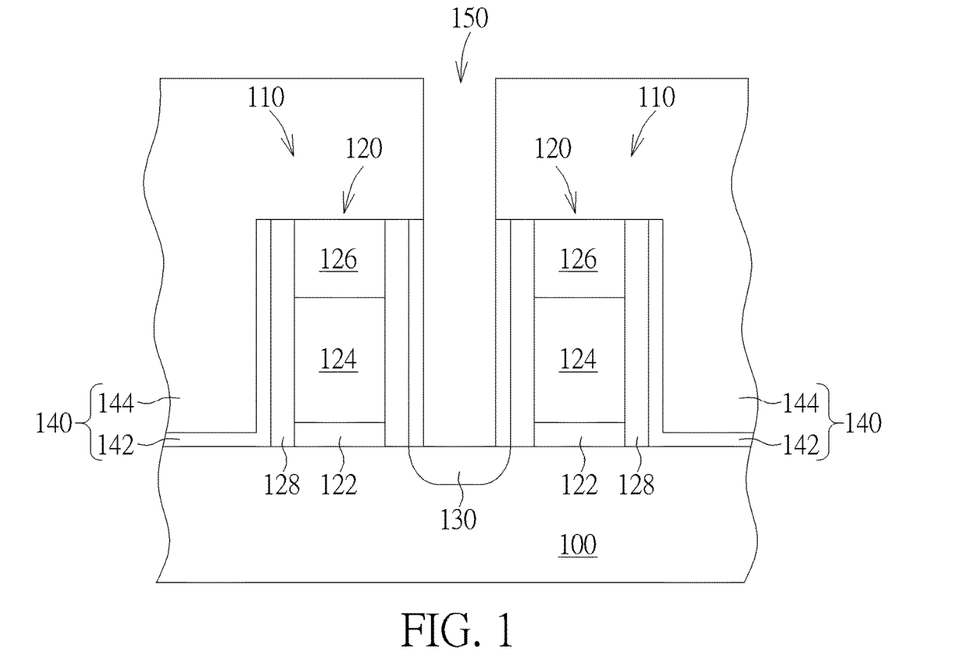

Please refer to FIGS. 1-6, which are schematic drawings illustrating a method for manufacturing a conductive structure provided by a first preferred embodiment of the present invention. As shown in FIG. 1, the preferred embodiment first provides a substrate 100 such as a silicon substrate, a silicon-containing substrate, or a silicon-on-insulator (SOI) substrate. The substrate 100 includes a plurality of shallow trench isolations (hereinafter abbreviated as STIs) (not shown), and the STIs are used to define a plurality of active regions for accommodating p-typed transistor devices and/or n-typed transistor devices, and to provide electrical isolation. In the preferred embodiment, a semiconductor layer such as a fin structure involved in fin field effect transistor (FinFET) approach is provided. The fin structure as shown in FIG. 1 can be formed by patterning a single crystalline silicon layer of a SOI substrate or a bulk silicon substrate by photolithographic etching pattern (PEP) method, multi patterning method, or, preferably, spacer self-aligned double-patterning (SADP), also known as sidewall image transfer (SIT) method. And the fin structure is taken as the substrate 100 in the preferred embodiment.

Please still refer to FIG. 1. Transistor devices 110 are formed on the substrate 100 as shown in FIG. 1. The transistor devices 110 respectively include a gate electrode 120 and a source/drain region 130. As shown in FIG. 1, the gate electrode 120 can include a gate dielectric layer 122, a gate conductive layer 124, and a cap layer 126. The gate dielectric layer 122 can include high-k gate dielectric layer, and the gate conductive layer 124 can include polysilicon layer or a multiple metal layer. The transistor devices 110 further respectively include lightly doped drains (LDDs) (not shown), spacers 128 formed on sidewall of the gate electrode 120, and a source/drain region 130. The spacers 128 can be multi-layered structures, but not limited to this. Furthermore, selective strain scheme (SSS) can be used in the preferred embodiment. For example, a selective epitaxial growth (SEG) method can be used to form the source/drain. When the transistor devices 110 are p-typed transistor device(s), epitaxial silicon layers of SiGe are used to form the source/drain region 130. When the transistor devices 110 are n-typed transistor device(s), epitaxial silicon layers of SiC or SiP are used to form the source/drain region 130. A dielectric layer 140 including an etch liner such as a contact etch stop layer (hereinafter abbreviated as CESL) 142 and an interlayer dielectric (hereinafter abbreviated as ILD) layer 144 is then formed on the semiconductor layer/the substrate 100. As shown in FIG. 1, the dielectric layer 140 encompasses and embeds the transistor devices 110.

Please still refer to FIG. 1. At least an opening 150 is then formed in the dielectric layer 140. It is noteworthy that in the preferred embodiment, the opening 150 is formed correspondingly to the source/drain region 130. More important, the source/drain region 130 is exposed at a bottom of the opening 150 as shown in FIG. 1.

Figure 2:
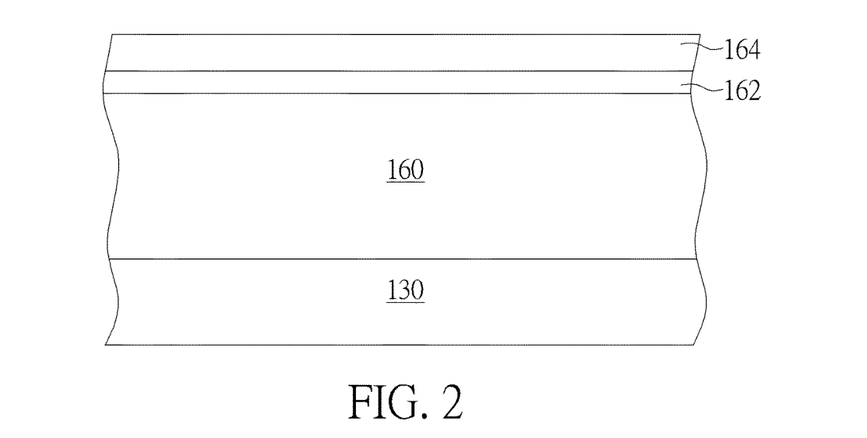
FIG. 2 is a schematic drawing in a step subsequent to FIG. 1 and an enlarged view of a portion of FIG. 1.

Please refer to FIG. 2, which is an enlarged view of a portion of FIG. 1. Specifically, the bottom of the opening 150 is enlarged as shown in FIG. 2. As shown in FIG. 2, the source/drain region 130 is exposed at the bottom of the opening 150 and followed by performing a pre-clean step. Next, a metal layer 160 such as a titanium (Ti) layer is deposited on the substrate 100. Particularly, the metal layer 160 is formed in the opening 150 and thus the metal layer 160 directly contacts the source/drain region 130. In some embodiments of the preferred present invention, a thickness of the metal layer 160 is about 140 angstroms (Å), but not limited to this. Subsequently, a first transition layer 162 and a second transition layer 164 are sequentially formed in the opening 150 as shown in FIG. 2. A thickness of the second transition layer 164 is larger than a thickness of the first transition layer 162. In some embodiments of the present invention, the thickness of first transition layer 162 can be between 10 Å and 20 Å, and the thickness of the second transition layer 164 can be 20 Å and 40 Å, but not limited to this. The second transistor layer 164 includes a first metal material and the first transition layer 162 includes a carbonitride of a second metal material. It is noteworthy that first metal material is different from the second metal material. For example but not limited to, the first metal material includes tungsten (W) and the second metal material include Ti. Therefore, the first transition layer 162 includes $TiN_xC_y$.

Figure 3:
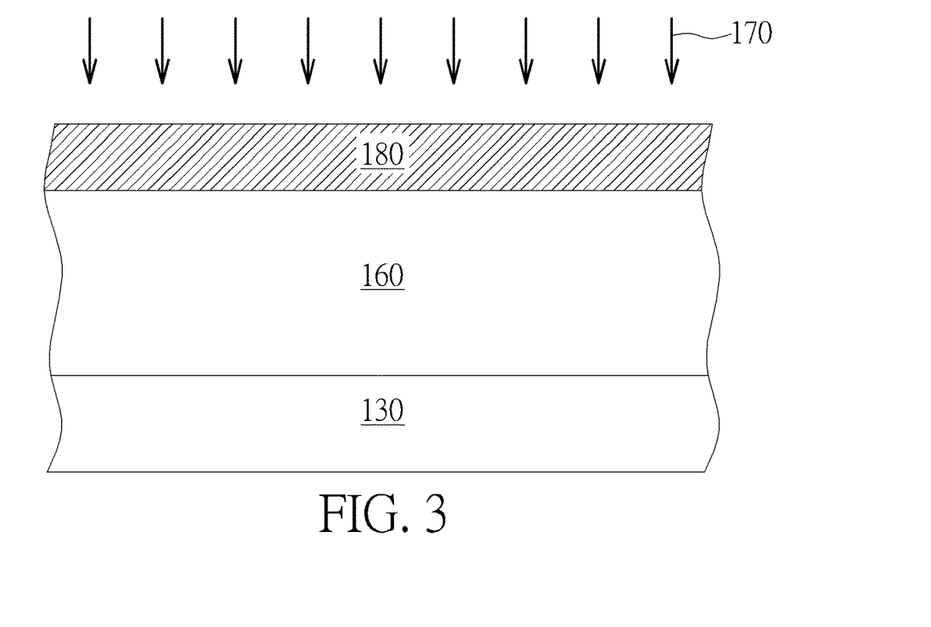
FIG. 3 is a schematic drawing in a step subsequent to FIG. 2.

Please refer to FIG. 3. Next, a treatment 170 is performed. In the preferred embodiment, the treatment 170 includes introducing nitrogen, but not limited to this. The nitrogen can be delivered through various nitrogen-containing precursors, such as $N_2$, $NH_3$, $H_2$, Ar, He, Ne or other similar gases and combinations of gases. The treatment 170 is performed to react the first transition layer 162 and the second transition layer 164 to form a material layer 180 on the metal layer 160. A resistance of the material layer 180 is lower than a resistance of the first transition layer 162 and thus the material layer 180 is also recognized as a low resistive layer 180. The low resistive layer 180 includes a carbonitride of the first metal material. Specifically, W from the second transition layer 164 is caught by carbon and nitrogen from the first transition layer 162 and nitrogen introduced by the treatment 170. On other hands, Ti in the first transition layer 162 is replaced by W. Therefore, the low resistive layer 180 includes WNC and Ti. In other words, the low resistive layer 180 includes a Ti-containing WNC layer.

Furthermore, since the low resistive layer 180 is obtained by reaction between the first transition layer 162 and the second transition layer 164, a thickness of the low resistive layer 180 is a sum of the thickness of the second transition layer 164 and the thickness of the first transition layer 162. Additionally, the metal layer 160 is sandwiched in between low resistive layer 180 and the source/drain region 130 as shown in FIG. 3 in accordance with the preferred embodiment.

Figure 4:
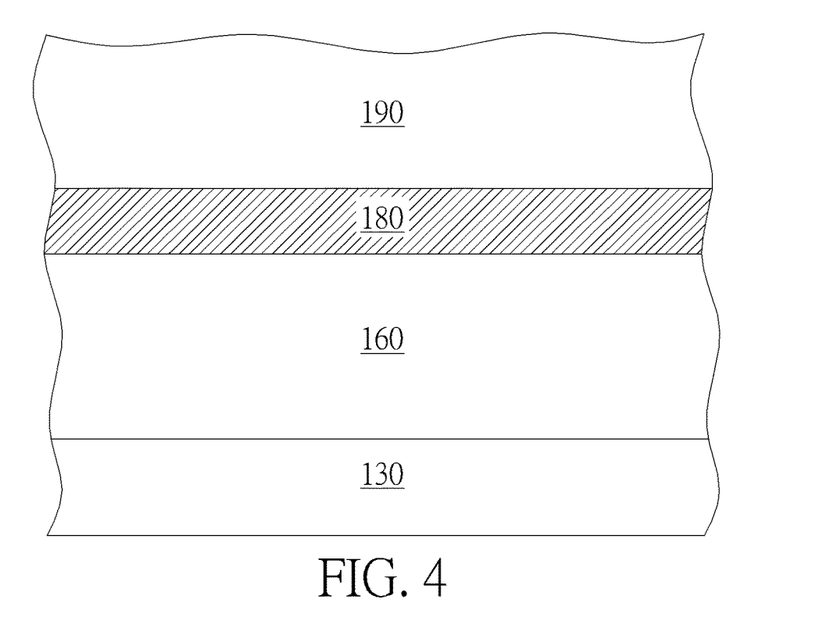
FIG. 4 is a schematic drawing in a step subsequent to FIG. 3.

Please refer to FIG. 4. Next, a metal bulk 190 is formed on the substrate 100 and the opening 150 is filled up with the metal bulk 190. It is noteworthy that the low resistive layer 180 serves as a nucleation layer for the metal bulk 190. It is well-known to those skilled in the art that a nucleation layer is a thin layer conformally formed and serves as a base to form a thicker layer including the same metal. Since the low resistive layer 180 includes the carbonitride of the first metal material, the metal bulk 190 preferably includes the first metal material. For example, since the low resistive layer 180 includes WNC in the preferred embodiment, the metal bulk 190 includes W.

Figure 5:
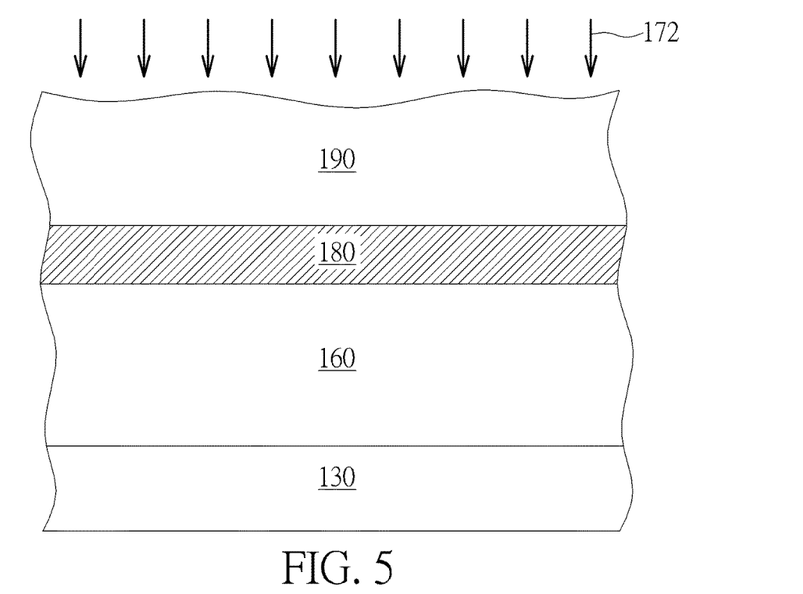
FIG. 5 is a schematic drawing in a step subsequent to FIG. 4.
Figure 6:
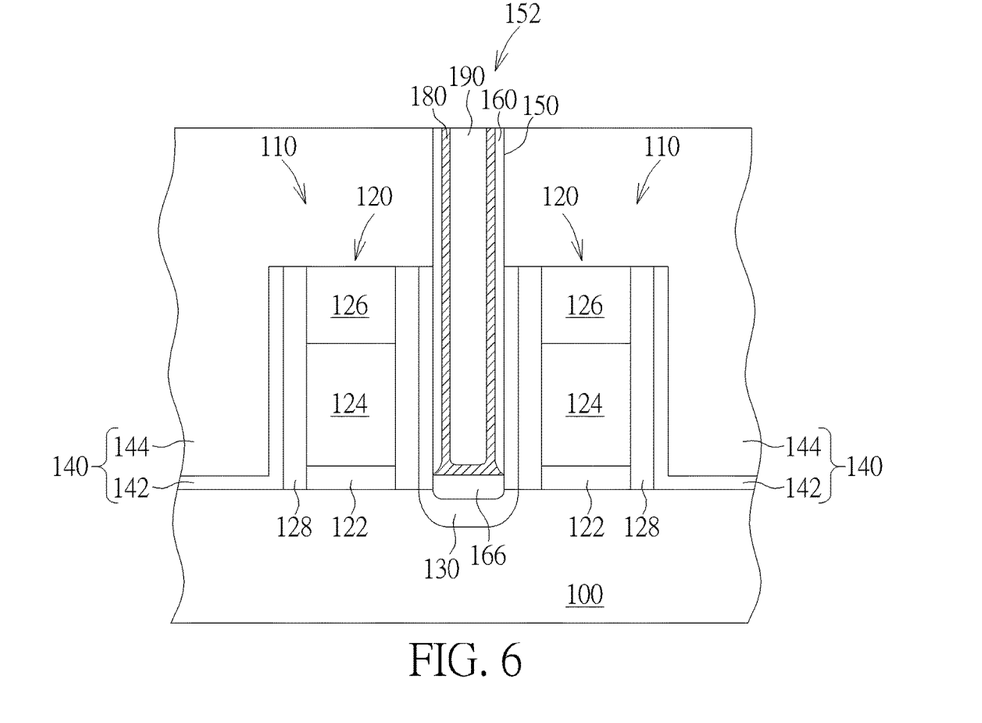
FIG. 6 is a schematic drawing in a step subsequent to FIG. 5.

Please refer to FIGS. 5 and 6. After forming the metal bulk 190, an anneal treatment 172 is performed to react the metal layer 160 and the source/drain region 130. Consequently, at least a portion of the source/drain region 130 is reacted with the metal layer 160 and thus a metal silicide layer 166 is formed under the low resistive layer 180 as shown in FIG. 6. In the preferred embodiment, the metal silicide layer 166 includes a Ti silicide layer. Particularly, the metal silicide layer 166 is sandwiched in between the low resistive layer 180 and the source/drain region 130.

Please refer to FIG. 6. After the anneal treatment 172, a planarization such as a Chemical-mechanical polishing (hereinafter abbreviated as CMP) method is performed to remove superfluous layer from a top surface of the dielectric layer 140. Consequently, a conductive structure 152 is formed in the opening 150 as shown in FIG. 6.

Please still refer to FIG. 6. The conductive structure 152 provided by the preferred embodiment includes the substrate 100 including the dielectric layer 140 formed thereon, at least the opening 150 formed in the dielectric layer 140, the low resistive layer 180 formed in the opening 150, and the metal bulk 190 formed on the lower resistive layer 180 in the opening 150. The metal bulk 190 directly contacts a surface of the low resistive layer 180. As mentioned above, the low resistive layer 180 includes the carbonitride of the first metal material, and the first metal bulk 190 includes the first metal material. Additionally, the low resistive layer 180 includes the second metal material originally from the first transition layer 162. Furthermore, the conductive structure 152 includes the metal silicide layer 166 formed under the low resistive layer 180 according to the preferred embodiment, and the low resistive layer 180 directly contacts a surface of the metal silicide layer 166. As shown in FIG. 6, the conductive structure 152 serves as a contact plug and a zeroth via structure V0 of an interconnection, and provides electrical connections between the transistor devices 110 and other devices.

According to the method for manufacturing the conductive structure 152 provided by the present invention, the treatment 170 is performed to form the low resistive layer 180, and the low resistive layer 180 serves as both of a barrier layer and a nucleation layer. Since the low resistive layer 180 serves as the barrier layer that prevent metal diffusion from the metal bulk 190, no extra barrier layer is needed. Furthermore, since the low resistive layer 180 serves as the nucleation layer for the subsequently formed metal bulk 190, no extra nucleation layer is needed. In other words, the contact structure 152 includes only three layers including the metal bulk 190, the low resistive layer 180, and the metal layer 160/metal silicide layer 166 according to the preferred embodiment. Accordingly, a thickness of the whole conductive structure 152 is reduced compared with the conventional conductive structure that requires both of the barrier layer and the nucleation layer. More important, the contact resistance is reduced, and the performance of the final fabricated circuits is improved.

Figure 7:
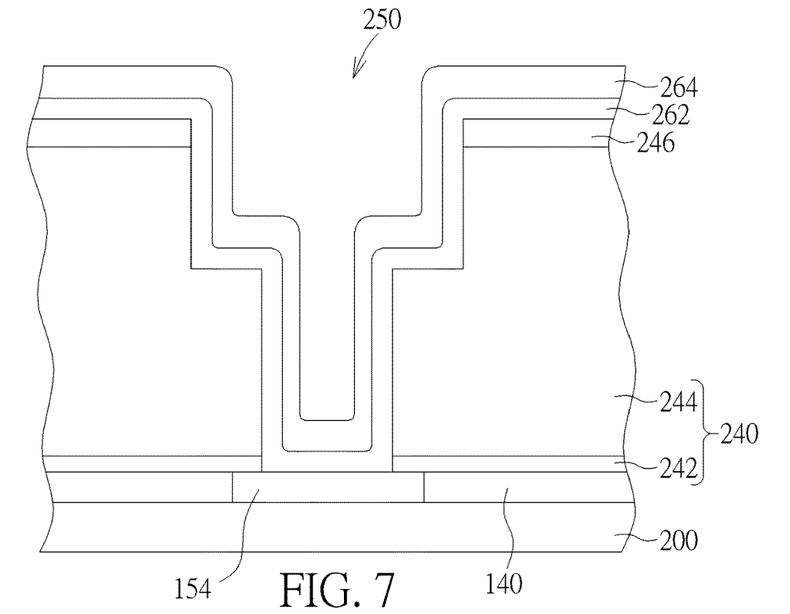
Figure 8:
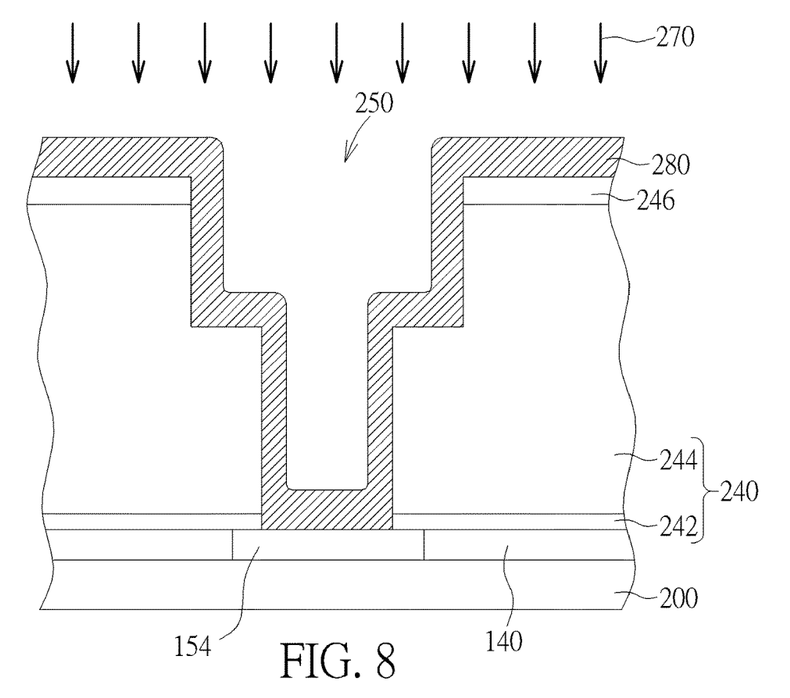
FIG. 8 is a schematic drawing in a step subsequent to FIG. 7.
Figure 9:
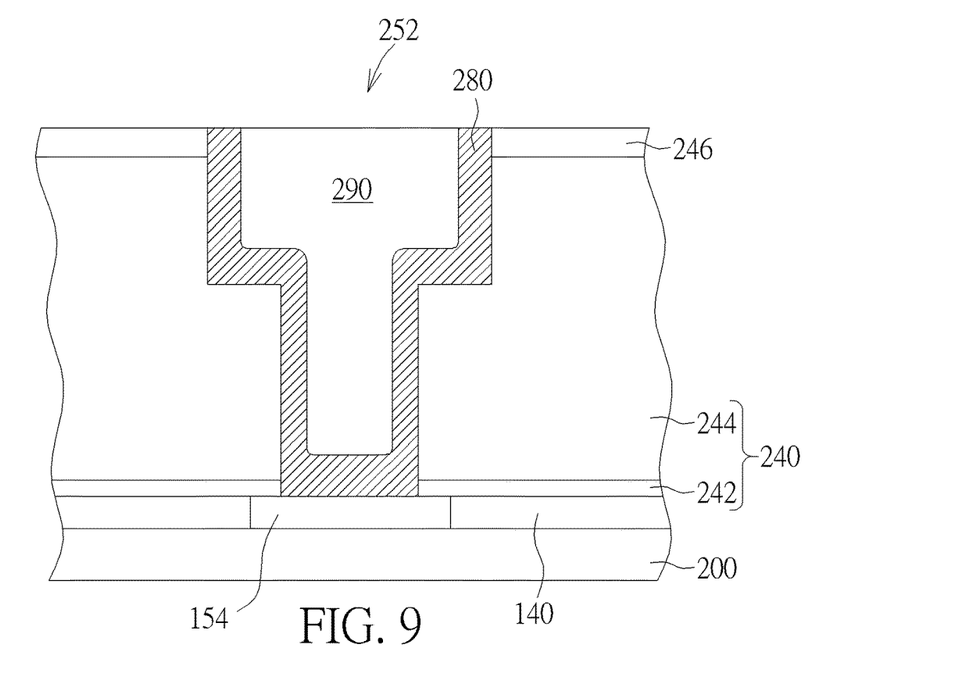
FIG. 9 is a schematic drawing in a step subsequent to FIG. 8.

Please refer to FIGS. 7-9, which are schematic drawings illustrating a method for manufacturing a conductive structure provided by a second preferred embodiment of the present invention. It is noteworthy that elements the same in both of the first and second preferred embodiments can include the same material, thus those details are omitted in the interest of brevity. As shown in FIG. 7, the preferred embodiment first provides a substrate 200 including active circuits formed therein, and the active circuits may include a plurality of transistor devices as mentioned in the aforementioned preferred embodiment. It should easily understood that those transistor devices can be formed on the substrate 200 as the transistor devices 110 shown in FIG. 6, however those transistor devices are omitted from FIG. 7 for simplicity. And a plurality of STIs (not shown) can be formed in the substrate 200 to isolate those devices. A dielectric layer 140 such as an ILD layer is formed on the substrate 200, and an opening (not shown) is formed in the dielectric layer 140. Next, steps as mentioned above are performed thus at least a conductive structure 154 such as a contact plug or a zeroth via structure V0 of an interconnection can be formed in the opening in the dielectric layer 140 on the substrate 200 as shown in FIG. 7. Accordingly, the conductive structure 154 can include layers the same with the conductive structure 152 mentioned in the first preferred embodiment, such as the metal bulk, the low resistive layer, and the metal layer/metal silicide layer. However, in some embodiments of the preferred embodiment, the conductive structure 154 can be an nth wiring layer of the interconnection structure. Accordingly, the conductive structure 154 can include W or aluminum (Al).

Please refer to FIG. 7 again. Next, a dielectric layer 240 sequentially including an etch stop layer 242 and an inter-metal dielectric (hereinafter abbreviated as IMD) layer 244 are formed on the dielectric layer 140 and the conductive structure 154. At least an opening 250 is formed in the dielectric layer 240 through a patterned hard mask 246. It is noteworthy that in the preferred embodiment, the opening 250 can be formed correspondingly to the conductive structure 154, but not limited to this. Additionally, the opening 250 can include a trench opening and/or a via opening, but not limited to this. The conductive structure 154 is exposed at a bottom of the opening 250.

Please still refer to FIG. 7. Next, a first transition layer 262 and a second transition layer 264 are sequentially formed in the opening 250 as shown in FIG. 7. A thickness of the second transition layer 264 is larger than a thickness of the first transition layer 262. The second transitor layer 264 includes a first metal material and the first transition layer 262 includes a carbonitride of a second metal material. It is noteworthy that first metal material is different from the second metal material. For example but not limited to, the first metal material includes W and the second metal material include Ti. Therefore, the first transition layer 262 includes $TiN_xC_y$.

Please refer to FIG. 8. Next, a treatment 270 is performed. In the preferred embodiment, the treatment 270 includes introducing nitrogen, but not limited to this. The nitrogen can be delivered through various nitrogen-containing precursors, such as $N_2$, $NH_3$, $H_2$, Ar, He, Ne or other similar gases and combinations of gases. The treatment 270 is performed to react the first transition layer 262 and the second transition layer 264 to form a material layer 280 in the opening 250. A resistance of the material layer 280 is lower than a resistance of the first transition layer 262 and thus the material layer 280 is also recognized as a low resistive layer 280. The low resistive layer 280 includes a carbonitride of the first metal material. Specifically, W from the second transition layer 264 is caught by carbon and nitrogen from the first transition layer 262 and nitrogen introduced by the treatment 270. On other hands, Ti in the first transition layer 262 is replaced by W. Therefore, the low resistive layer 280 includes WNC and Ti. In other words, the low resistive layer 280 includes a Ti-containing WNC layer. Furthermore, since the low resistive layer 280 is obtained by reaction between the first transition layer 262 and the second transition layer 264, a thickness of the low resistive layer 280 is a sum of the thickness of the second transition layer 264 and the thickness of the first transition layer 262. Furthermore, the conductive structure 154 exposed at the bottom opening 250 directly contacts the low resistive layer 280 as shown in FIG. 8. As mentioned above, in some embodiment of the present invention that the conductive structure 154 includes the layers the same with those mentioned in the first embodiments, the low resistive layer 280 contacts at least the metal bulk of the conductive structure 154.

Please refer to FIG. 9. Next, a metal bulk 290 is formed on the substrate 200 and the opening 250 is filled up with the metal bulk 290. It is noteworthy that the low resistive layer 280 serves as a nucleation layer for the metal bulk 290. It is well-known to those skilled in the art that a nucleation layer is a thin layer conformally formed and serves as a base to form a thicker layer including the same metal. Since the low resistive layer 280 includes the carbonitride of the first metal material, the metal bulk 290 preferably includes the first metal material. For example, since the low resistive layer 280 includes WNC in the preferred embodiment, the metal bulk 290 includes W.

Please refer to FIG. 9. After forming the metal bulk 290, a planarization such as a CMP method is performed to remove superfluous layer from a top surface of the dielectric layer 240. Consequently, a conductive structure 252 is formed in the opening 250 as shown in FIG. 9.

Please refer to FIG. 9. The conductive structure 252 provided by the preferred embodiment includes the substrate 200 including the dielectric layer 240 formed thereon, at least the opening 250 formed in the dielectric layer 240, the low resistive layer 280 formed in the opening 250, and the metal bulk 290 formed on the lower resistive layer 280 in the opening 250. The metal bulk 290 directly contacts a surface of the low resistive layer 280. As mentioned above, the low resistive layer 280 includes the carbonitride of the first metal material, and the first metal bulk 290 includes the first metal material. And the low resistive layer 280 directly contacts the metal bulk of the conductive structure 154. As shown in FIG. 9, the conductive structure 252 serves as an nth wiring layer Mn and an n−1th via structure Vn−1 of an interconnection.

Figure 10:
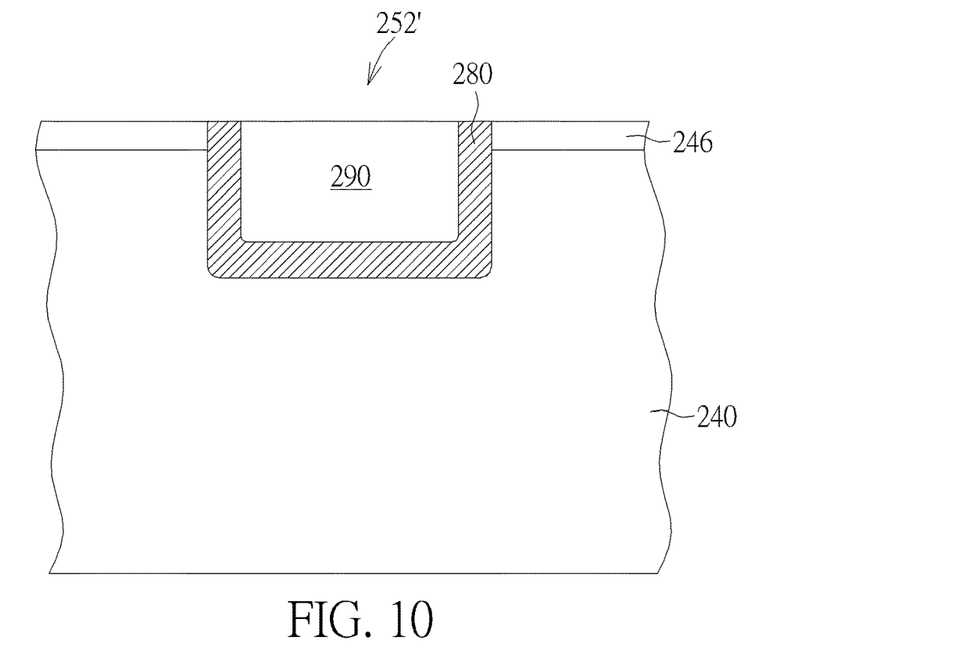
FIG. 10 is a schematic drawing illustrating a modification to the second preferred embodiment.

Please refer to FIG. 10, which is a modification to the second preferred embodiment. It should be noted that elements the same in the modification and the second preferred embodiment are designated by the same numerals, and details of those elements are omitted for simplicity. According to the modification, the conductive structure 252' includes a lateral nth wiring layer Mn of an interconnection structure. The conductive structure 252' can be formed by the steps as mentioned above, and thus the conductive structure 252' includes the low resistive layer 280 and the metal bulk 290. As shown in FIG. 10, the low resistive layer 280 directly contacts the dielectric layer 240.

According to the method for manufacturing the conductive structure 252/252' provided by the present invention, the treatment 270 is performed to form the low resistive layer 280, and the low resistive layer 280 serves as both of a barrier layer and a nucleation layer. Since the low resistive layer serves as the barrier layer that prevent metal diffusion from the metal bulk 290, no extra barrier layer is needed. Furthermore, since the low resistive layer 280 serves as the nucleation layer for the subsequently formed metal bulk 290, no extra nucleation layer is needed. In other words, the contact structure 252/252' includes only two layers including the metal bulk 290 and the low resistive layer 280 according to the preferred embodiment. Accordingly, a thickness of the whole conductive structure 252/252' is reduced compared with the conventional conductive structure that requires both of the barrier layer and the nucleation layer. More important, the contact resistance is reduced, and the performance of the final fabricated circuits is improved.

According to the method for manufacturing the conductive structure provided by the present invention, the low resistive layer is formed by the reaction between the first transition layer and the second transition layer caused by the treatment, and the low resistive layer serves as both the barrier layer and the nucleation layer. Consequently, thickness of the whole conductive structure is reduced. More important, since the contact resistance is reduced, the performance of the final fabricated circuits is improved. Furthermore, the method for manufacturing the conductive structure provided by the present invention can be integrated into both the FEOL process and the BEOL process, therefore the process flexibility integration are further improved according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a conductive structure, comprising:

providing a substrate comprising a first dielectric layer formed thereon, and at least an opening being formed in the first dielectric layer;

forming a first transition layer in the opening;

forming a second transition layer on the first transition layer, the second transition layer comprising a first metal material;

performing a treatment to react the first transition layer and the second transition layer to form a low resistive layer comprising a carbonitride of the first metal material; and filing the opening with a first metal bulk, and the first metal bulk comprising the first metal material.

2. The method for manufacturing the conductive structure according to claim 1, wherein the first metal material comprises W.

3. The method for manufacturing the conductive structure according to claim 1, wherein the first transition layer comprises carbonitride of a second metal material, and the low resistive layer further comprises the second metal material.

4. The method for manufacturing the conductive structure according to claim 3, wherein the second metal material comprise titanium.

5. The method for manufacturing the conductive structure according to claim 1, wherein a thickness of the second transition layer is larger than a thickness of the first transition layer.

6. The method for manufacturing the conductive structure according to claim 5, wherein a thickness of the low resistive layer is a sum of the thickness of the second transition layer and the thickness of the first transition layer.

7. The method for manufacturing the conductive structure according to claim 1, further comprising:
   at least a transistor device formed on the substrate, and the transistor device comprising a gate electrode and a source/drain region; and
   a metal layer sandwiched in between the low resistive layer and the source/drain region.

8. The method for manufacturing the conductive structure according to claim 7, further comprising performing an anneal treatment to react the metal layer and the source/drain region to form a metal silicide layer.

9. The method for manufacturing the conductive structure according to claim 1, further comprising:
   at least a second dielectric layer formed under the first dielectric layer; and
   at least a second metal bulk formed in the second dielectric layer, and the second metal bulk comprising tungsten or aluminum, wherein the low resistive layer directly contacting the second metal bulk.

* * * * *